US010340083B2

(12) United States Patent
Wakashima et al.

(10) Patent No.: US 10,340,083 B2
(45) Date of Patent: Jul. 2, 2019

(54) ELECTRONIC COMPONENT

(71) Applicant: Murata Manufacturing Co., Ltd., Nagaokakyo-shi, Kyoto-fu (JP)

(72) Inventors: Masahiro Wakashima, Nagaokakyo (JP); Yuta Saito, Nagaokakyo (JP); Kohei Shimada, Nagaokakyo (JP); Naobumi Ikegami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 71 days.

(21) Appl. No.: 15/669,044

(22) Filed: Aug. 4, 2017

(65) Prior Publication Data

US 2018/0040426 A1    Feb. 8, 2018

(30) Foreign Application Priority Data

Aug. 5, 2016    (JP) .................. 2016-154707

(51) Int. Cl.
*H01G 4/30*   (2006.01)
*H01G 4/248*  (2006.01)
(Continued)

(52) U.S. Cl.
CPC ............. *H01G 4/248* (2013.01); *H01G 2/06* (2013.01); *H01G 4/232* (2013.01); *H01G 4/30* (2013.01);
(Continued)

(58) Field of Classification Search
CPC .. H01G 4/30; H01G 4/08; H01G 4/12; H01G 4/38; H01G 4/228; H01G 4/232; H01G 4/248; H05K 1/18; H05K 3/30
(Continued)

(56) References Cited

U.S. PATENT DOCUMENTS

2008/0186652 A1*   8/2008   Lee .................. H01G 4/012
                                                     361/306.3
2011/0114378 A1    5/2011   Yoshii et al.
(Continued)

FOREIGN PATENT DOCUMENTS

JP    2011-108827 A    6/2011

*Primary Examiner* — Xiaoliang Chen
(74) *Attorney, Agent, or Firm* — Keating & Bennett, LLP

(57) ABSTRACT

An electronic component is able to be mounted on a mounting substrate including a pair of first edge portions that faces each other, and a pair of second edge portions that is perpendicular or substantially perpendicular to the pair of first edge portions and faces each other. The mounting substrate has a structure that allows at least any one of the electronic component, a first electronic component, and a second electronic component, to be mounted thereon. When a dimension of the first electronic component in a length direction is designated as L1, a dimension of the first electronic component in a width direction is designated as W1, a dimension of the second electronic component in the length direction is designated as L2, and a dimension of the second electronic component in the width direction is designated as W2, a dimension of the electronic component in the width direction is any one of W1 and W2. A dimension of the electronic component in the length direction is L2 when the dimension of the electronic component in the width direction is W1, and is L1 when the dimension of the electronic component in the width direction is W2.

10 Claims, 9 Drawing Sheets

(51) Int. Cl.
    *H05K 1/18*         (2006.01)
    *H01G 4/38*         (2006.01)
    *H01G 2/06*         (2006.01)
    *H01G 4/232*        (2006.01)
    *H01G 4/12*         (2006.01)
    *H05K 3/34*         (2006.01)

(52) U.S. Cl.
    CPC ............... *H01G 4/38* (2013.01); *H05K 1/181* (2013.01); *H01G 4/1245* (2013.01); *H05K 3/3442* (2013.01); *H05K 2201/10015* (2013.01); *Y02P 70/611* (2015.11)

(58) Field of Classification Search
    USPC .................... 174/260; 361/305, 306.3, 321.4; 501/137, 139; 1/1
    See application file for complete search history.

(56) References Cited

U.S. PATENT DOCUMENTS

| | | | | |
|---|---|---|---|---|
| 2013/0083449 A1* | 4/2013 | Yoon | ................... | C04B 35/4682 361/321.4 |
| 2013/0163249 A1* | 6/2013 | Miura | ................... | H05K 1/0287 362/249.02 |
| 2013/0250478 A1* | 9/2013 | Kim | ...................... | C04B 35/468 361/305 |
| 2014/0332261 A1* | 11/2014 | Fujimoto | ................. | H01G 4/30 174/260 |
| 2016/0203787 A1* | 7/2016 | Park | ........................ | G09G 5/00 345/206 |

* cited by examiner

FIG. 6

| | Ba | Ti | Dy | Mg | V | RELIABILITY EVALUATION | TEMPERATURE PROPERTY EVALUATION | FINE PARTICLE |
|---|---|---|---|---|---|---|---|---|
| COMPARATIVE EXAMPLE 1 | 101.8 | 100 | 1.06 | 0.39 | 0.32 | NG | G | G |
| EXAMPLE 1 | 101.8 | 100 | 1.08 | 0.39 | 0.32 | G | G | G |
| EXAMPLE 2 | 101.8 | 100 | 1.15 | 0.39 | 0.32 | G | G | G |
| EXAMPLE 3 | 101.8 | 100 | 1.2 | 0.39 | 0.32 | G | G | G |
| EXAMPLE 4 | 101.8 | 100 | 1.25 | 0.39 | 0.32 | G | G | G |
| EXAMPLE 5 | 101.8 | 100 | 1.3 | 0.39 | 0.32 | G | G | G |
| EXAMPLE 6 | 101.8 | 100 | 1.32 | 0.39 | 0.32 | G | G | G |
| COMPARATIVE EXAMPLE 2 | 101.8 | 100 | 1.4 | 0.39 | 0.32 | NG | G | G |
| COMPARATIVE EXAMPLE 3 | 101.8 | 100 | 1.2 | 0.34 | 0.32 | G | G | NG |
| EXAMPLE 7 | 101.8 | 100 | 1.2 | 0.351 | 0.32 | G | G | G |
| EXAMPLE 8 | 101.8 | 100 | 1.2 | 0.4 | 0.32 | G | G | G |
| EXAMPLE 9 | 101.8 | 100 | 1.2 | 0.42 | 0.32 | G | G | G |
| EXAMPLE 10 | 101.8 | 100 | 1.2 | 0.425 | 0.32 | G | G | G |
| EXAMPLE 11 | 101.8 | 100 | 1.2 | 0.429 | 0.32 | G | G | G |
| COMPARATIVE EXAMPLE 4 | 101.8 | 100 | 1.2 | 0.45 | 0.32 | G | G | NG |
| COMPARATIVE EXAMPLE 5 | 101.8 | 100 | 1.2 | 0.39 | 0.27 | G | NG | G |
| COMPARATIVE EXAMPLE 6 | 101.8 | 100 | 1.2 | 0.39 | 0.28 | G | NG | G |
| COMPARATIVE EXAMPLE 7 | 101.8 | 100 | 1.2 | 0.39 | 0.284 | G | NG | G |
| EXAMPLE 12 | 101.8 | 100 | 1.2 | 0.39 | 0.288 | G | G | G |
| EXAMPLE 13 | 101.8 | 100 | 1.2 | 0.39 | 0.29 | G | G | G |
| EXAMPLE 14 | 101.8 | 100 | 1.2 | 0.39 | 0.31 | G | G | G |
| EXAMPLE 15 | 101.8 | 100 | 1.2 | 0.39 | 0.32 | G | G | G |
| EXAMPLE 16 | 101.8 | 100 | 1.2 | 0.39 | 0.35 | G | G | G |
| COMPARATIVE EXAMPLE 4 | 101.8 | 100 | 1.2 | 0.39 | 0.36 | G | NG | G |

ELECTRONIC COMPONENT

CROSS REFERENCE TO RELATED APPLICATIONS

This application claims the benefit of priority to Japanese Patent Application No. 2016-154707 filed on Aug. 5, 2016. The entire contents of this application are hereby incorporated herein by reference.

BACKGROUND OF THE INVENTION

1. Field of the Invention

The present invention relates to an electronic component provided with a laminate including dielectric layers and inner electrode layers alternately laminated.

2. Description of the Related Art

Documents that disclose a mounting substrate on which a multilayer ceramic capacitor as an electronic component is mounted includes, for example, Japanese Patent Laid-Open No. 2011-108827. The mounting substrate on which a multilayer ceramic capacitor is mounted is used for an electronic apparatus.

In recent years, electronic apparatuses have been reduced in size. Accordingly, mounting substrates have been reduced in size, so that a mounting area for mounting an electronic component, such as a multilayer ceramic capacitor, has also been minimized. Multilayer ceramic capacitors each typically have a normalized size. Normalized sizes include a size including a length (dimension L) of 0.4 mm, a width (dimension W) of 0.2 mm, and a height (dimension T) of 0.2 mm, a size including a dimension L of 0.6 mm, a dimension W of 0.3 mm, and a dimension T of 0.3 mm, and a size including a dimension L of 1.0 mm, a dimension W of 0.5 mm, and a dimension T of 0.5 mm, for example.

Thus, a multilayer ceramic capacitor may not be efficiently mounted on a mounting substrate depending on a relation in size between the mounting substrate and the multilayer ceramic capacitor.

SUMMARY OF THE INVENTION

Preferred embodiments of the present invention provide electronic components that are able to be efficiently mounted on a mounting substrate.

An electronic component according to a first aspect of a preferred embodiment of the present invention is able to be mounted on a mounting substrate including a pair of first edge portions that faces each other, and a pair of second edge portions that is perpendicular or substantially perpendicular to the pair of first edge portions and faces each other. The first electronic component includes: a first laminate including a plurality of first dielectric layers and a plurality of first inner electrode layers, which are laminated, a pair of first principal surfaces facing each other in a lamination direction, a pair of first side surfaces facing each other in a width direction perpendicular or substantially perpendicular to the lamination direction, and a pair of first end surfaces facing each other in a length direction perpendicular or substantially perpendicular to the lamination direction and the width direction; and a pair of first external electrodes each extending from a corresponding one of the pair of first end surfaces to a portion of the pair of first principal surfaces and to a portion of the pair of first side surfaces. The second electronic component includes: a second laminate including a plurality of second dielectric layers and a plurality of second inner electrode layers, which are laminated, a pair of second principal surfaces facing each other in a lamination direction, a pair of second side surfaces facing each other in a width direction perpendicular or substantially perpendicular to the lamination direction, and a pair of second end surfaces facing each other in a length direction perpendicular or substantially perpendicular to the lamination direction and the width direction; and a pair of second external electrodes each extending from a corresponding one of the pair of second end surfaces to a portion of the pair of second principal surfaces and to a portion of the pair of second side surfaces. When a dimension of the first electronic component in the length direction is designated as L1, a dimension of the first electronic component in the width direction is designated as W1, a dimension of the second electronic component in the length direction is designated as L2, and a dimension of the second electronic component in the width direction is designated as W2, a length W3 of the pair of first edge portions is the least common multiple of the W1 and the W2, and a length L3 of the pair of second edge portions is the least common multiple of the L1 and the L2. The electronic component includes: a third laminate including a plurality of third dielectric layers and a plurality of third inner electrode layers, which are laminated, a pair of third principal surfaces facing each other in a lamination direction, a pair of third side surfaces facing each other in a width direction perpendicular or substantially perpendicular to the lamination direction, and a pair of third end surfaces facing each other in a length direction perpendicular or substantially perpendicular to the lamination direction and the width direction; and a pair of third external electrodes each extending from a corresponding one of the pair of third end surfaces to a portion of the pair of third principal surfaces and to a portion of the pair of third side surfaces. A dimension of the electronic component in the width direction is any one of the W1 and the W2, and a dimension of the electronic component in the length direction is the L2 when the dimension of the electronic component in the width direction is the W1, and a dimension of the electronic component in the length direction is the L1 when the dimension of the electronic component in the width direction is the W2.

In an electronic component according to the first aspect of a preferred embodiment of the present invention, it is preferable that the L1 is about 0.6 mm±20%, and that the W1 is about 0.3 mm±20%. In addition, it is preferable that the L2 is about 0.4 mm±20%, and that the W2 is about 0.2 mm±20%, for example.

An electronic component according to the first aspect of a preferred embodiment of the present invention has a dimension T3 as a dimension in a height direction. In this case, it is preferable that the T3 is about 0.4 mm±20%, for example.

It is preferable that an electronic component according to the first aspect of a preferred embodiment of the present invention is a multilayer ceramic capacitor.

An electronic component according to a second aspect of a preferred embodiment of the present invention is able to be mounted on a mounting substrate including a pair of first edge portions that faces each other, and a pair of second edge portions that is perpendicular or substantially perpendicular to the pair of first edge portions and faces each other. The mounting substrate has a structure that allows at least any one of the electronic component, a first electronic component, and a second electronic component to be mounted thereon. The first electronic component includes: a first laminate including a plurality of first dielectric layers and a plurality of first inner electrode layers, which are laminated, a pair of first principal surfaces facing each other in a lamination direction, a pair of first side surfaces facing each other in a width direction perpendicular or substantially perpendicular to the lamination direction, and a pair of first end surfaces facing each other in a length direction perpendicular or substantially perpendicular to the lamination direction and the width direction; and a pair of first external electrodes each extending from a corresponding one of the pair of first end surfaces to a portion of the pair of first principal surfaces and to a portion of the pair of first side surfaces. The second electronic component includes: a second laminate including a plurality of second dielectric layers and a plurality of second inner electrode layers, which are laminated, a pair of second principal surfaces facing each other in a lamination direction, a pair of second side surfaces facing each other in a width direction perpendicular or substantially perpendicular to the lamination direction, and a pair of second end surfaces facing each other in a length direction perpendicular or substantially perpendicular to the lamination direction and the width direction; and a pair of second external electrodes each extending from a corresponding one of the pair of second end surfaces to a portion of the pair of second principal surfaces and to a portion of the pair of second side surfaces. When a dimension of the first electronic component in the length direction is designated as L1, a dimension of the first electronic component in the width direction is designated as W1, a dimension of the second electronic component in the length direction is designated as L2, and a dimension of the second electronic component in the width direction is designated as W2, a length W3 of the pair of first edge portions is the least common multiple of the W1 and the W2, and a length L3 of the pair of second edge portions is the least common multiple of the L1 and the L2. The electronic component includes: a third laminate including a plurality of third dielectric layers, a plurality of third inner electrode layers, which are laminated, a pair of third principal surfaces facing each other in a lamination direction, a pair of third side surfaces facing each other in a width direction perpendicular or substantially perpendicular to the lamination direction, and a pair of third end surfaces facing each other in a length direction perpendicular or substantially perpendicular to the lamination direction and the width direction; and a pair of third external electrodes each extending from a corresponding one of the pair of third end surfaces to a portion of the pair of third principal surfaces and to a portion of the pair of third side surfaces. A dimension of the electronic component in the width direction is the W2 that is about 0.30 mm±20%, a dimension of the electronic component in the length direction is the L1 that is about 0.40 mm±20%, and a dimension of the electronic component in the lamination direction is T3 that is about 0.40 mm±20%, for example. The third dielectric layer contains Ba, Ti, Dy, Mg, Mn, Si, V, Al, and Zr, in which a content of Dy contained in the third dielectric layer is not less than about 1.08 parts by mole and not more than about 1.32 parts by mole based on 100 parts by mole of Ti, a content of Mg contained in the third dielectric layer is not less than about 0.351 part by mole and not more than about 0.429 part by mole based on 100 parts by mole of Ti, and a content of V contained in the third dielectric layer is not less than about 0.288 part by mole and not more than about 0.35 part by mole based on 100 parts by mole of Ti, for example. The third inner electrode layer includes a fourth inner electrode layer that reaches one of the pair of third end surfaces to be electrically connected to the one of the pair of third external electrodes, and a fifth inner electrode layer that reaches the other of the pair of third end surfaces to be electrically connected to the other of the pair of third external electrodes. As viewed from the lamination direction, a distance between an end of the third inner electrode layer positioned on the one of the pair of third side surfaces and the one of the third side surfaces, along the width direction, as well as a distance between an end of the fourth inner electrode layer positioned on the other of the pair of third side surfaces and the other of the third side surfaces, along the width direction, is not less than about 20 µm and not more than about 40 µm, and a distance between an end of the fourth inner electrode layer positioned on the other of the third end surfaces and the other of the third end surfaces, along the length direction, as well as a distance between an end of the fifth inner electrode layer positioned on the one of the third end surfaces and the one of the third end surfaces, along the length direction, is not less than about 30 µm and not more than about 50 µm, for example.

According to preferred embodiments of the present invention, it is possible to provide electronic components that are able to be efficiently mounted on a mounting substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a table showing results of reliability evaluation, temperature property evaluation, and atomization evaluation of multilayer ceramic capacitors according to examples and comparative examples.

DETAILED DESCRIPTION OF THE PREFERRED EMBODIMENTS

Figure 1:
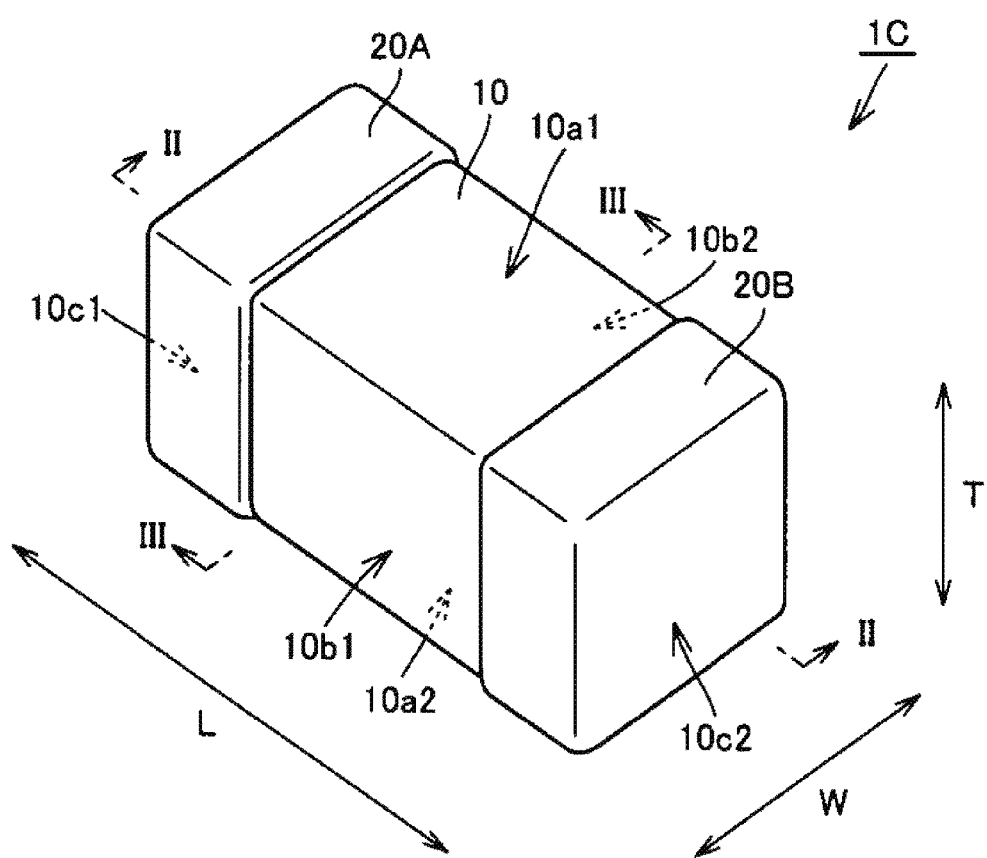
FIG. 1 is a schematic perspective view of a multilayer ceramic capacitor according to a preferred embodiment of the present invention.

Hereinafter, preferred embodiments of the present invention will be described in detail with reference to the accompanying drawings. In the preferred embodiments described below, a multilayer ceramic capacitor will be described as an electronic component, for example. In addition, in the preferred embodiments described below, an identical or common portion or element is designated by the same reference numeral in the drawings, and a description thereof is not duplicated.

Figure 2:
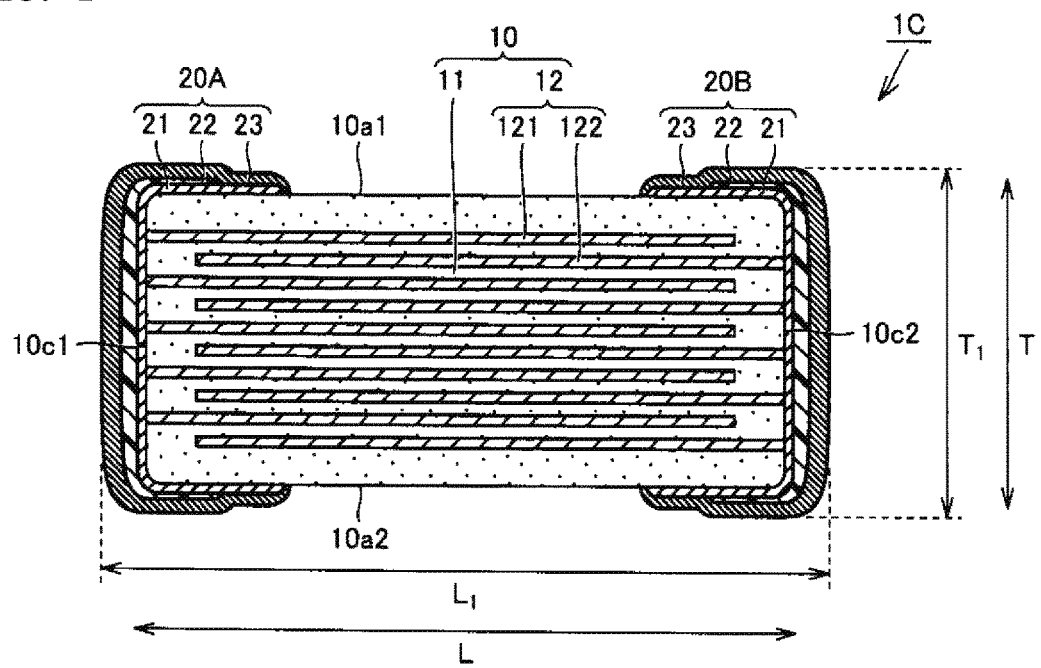
FIG. 2 is a schematic sectional view taken along line II-II illustrated in FIG. 1.
Figure 3:
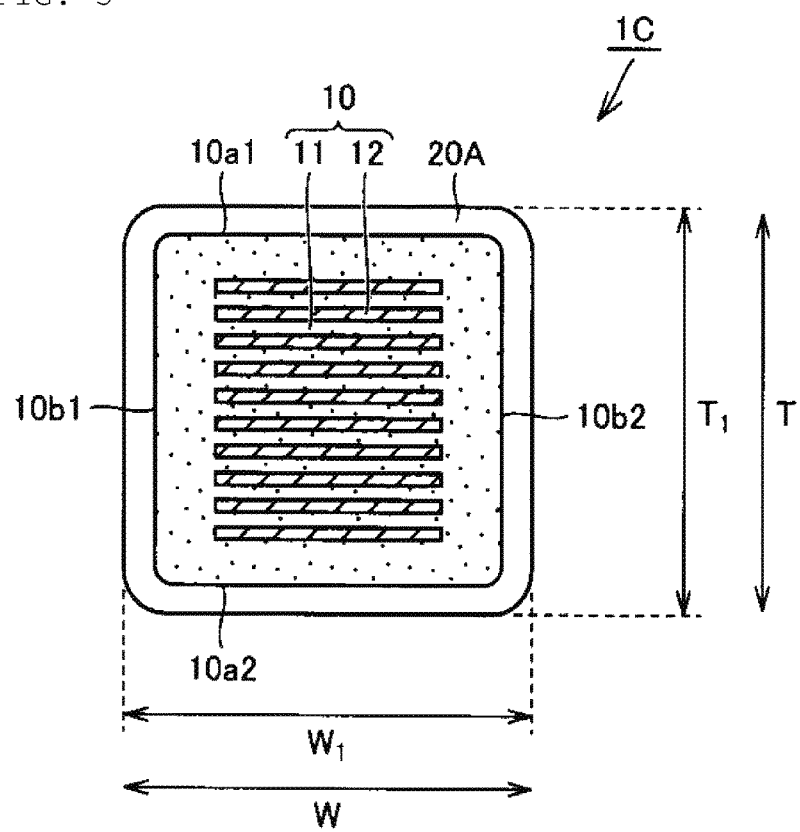
FIG. 3 is a schematic sectional view taken along line III-III illustrated in FIG. 1.
Figure 4:
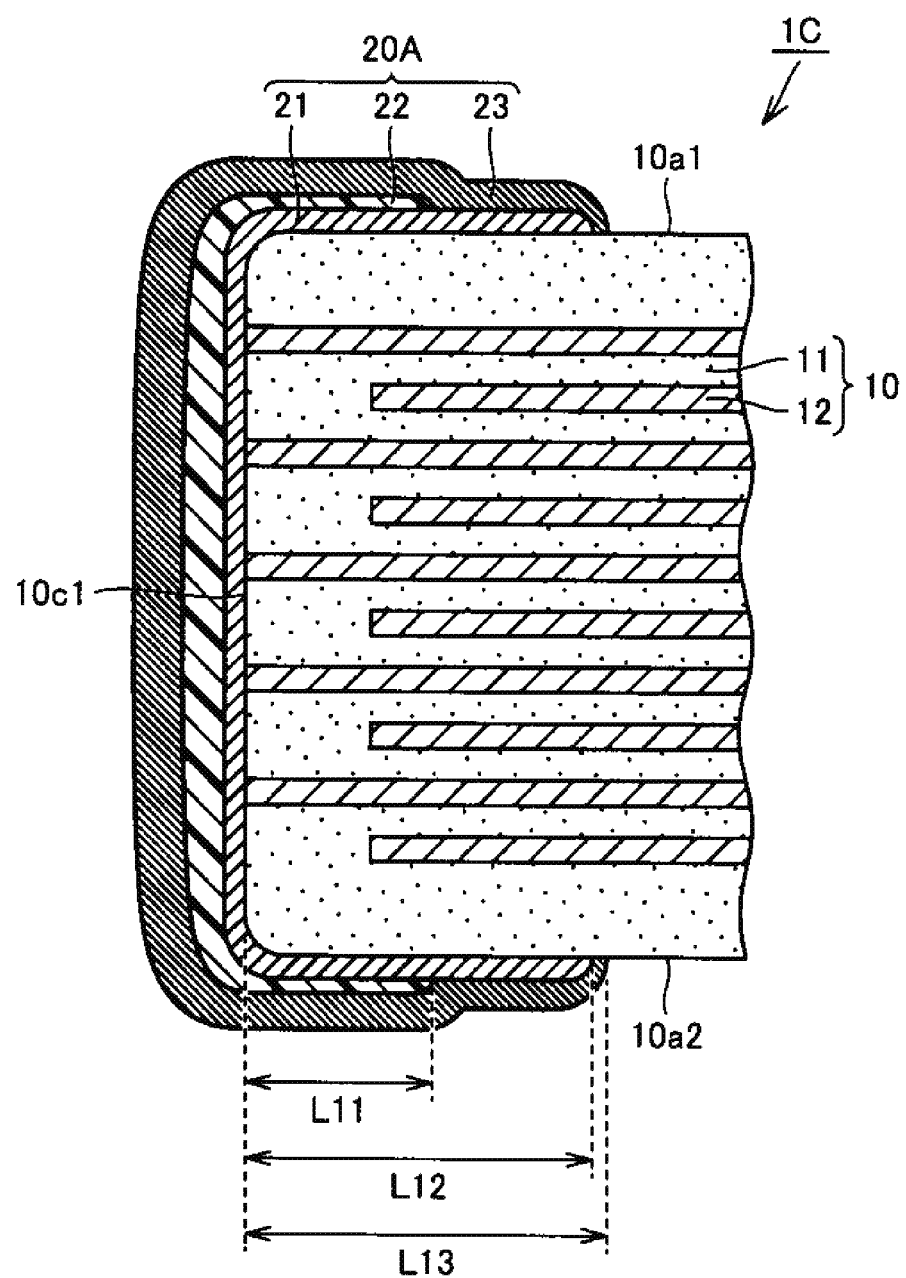
FIG. 4 is an enlarged sectional view of a main section illustrated in FIG. 2.

FIG. 1 is a schematic perspective view of a multilayer ceramic capacitor according to a present preferred embodiment of the present invention. FIG. 2 is a schematic sectional view taken along line II-II illustrated in FIG. 1. FIG. 3 is a schematic sectional view taken along line III-III illustrated in FIG. 1. FIG. 4 is an enlarged sectional view of a main section illustrated in FIG. 2. With reference to FIGS. 1 to 4, a multilayer ceramic capacitor 1C according to the present preferred embodiment will be described. The multilayer ceramic capacitor 1C corresponds to an electronic component.

As illustrated in FIGS. 1 to 3, the multilayer ceramic capacitor 1C according to the present preferred embodiment preferably has a rectangular or substantially rectangular parallelepiped outline, and includes a laminate 10 and a pair of external electrodes 20A and 20B. The pair of external electrodes 20A and 20B corresponds to a pair of third external electrodes.

The laminate 10 preferably has a rectangular or substantially rectangular parallelepiped outline. The laminate 10 includes a plurality of dielectric layers 11 and a plurality of inner electrode layers 12, which are laminated. The dielectric layer 11 corresponds to a third dielectric layer, and the inner electrode layer 12 corresponds to a third inner electrode layer.

The laminate 10 also includes a pair of principal surfaces 10a1 and 10a2 facing each other in a lamination direction T of the plurality of dielectric layers 11 and the plurality of inner electrode layers 12, a pair of side surfaces 10b1 and 10b2 facing each other in a width direction W perpendicular or substantially perpendicular to the lamination direction T, and a pair of end surface 10c1 and 10c2 facing each other in a length direction L perpendicular or substantially perpendicular to both the lamination direction T and the width direction W.

The pair of principal surfaces 10a1 and 10a2 corresponds to a pair of third principal surfaces, the pair of side surfaces 10b1 and 10b2 corresponds to a pair of third side surface, and the pair of end surfaces 10c1 and 10c2 corresponds to a pair of third end surfaces. The laminate 10 corresponds to a third laminate.

While the outline of the laminate 10 preferably is substantially rectangular parallelepiped, it is preferable that corners and ridge line portions of the laminate 10 are rounded. Each of the corners is a portion at which three surfaces of the laminate 10 intersect with each other, and each of the ridge line portions is a portion at which two surfaces of the laminate 10 intersect with each other. In addition, asperities may be provided in at least one of the pair of principal surfaces 10a1 and 10a2, the pair of side surfaces 10b1 and 10b2, and the pair of end surfaces 10c1 and 10c2.

The laminate 10 is divided into an inner layer portion and a pair of outer layer portions in the lamination direction T. Each of the pair of outer layer portions is positioned adjacent to the corresponding one of the pair of principal surfaces 10a1 and 10a2 of the laminate 10.

One of the pair of outer layer portions is defined by one of the dielectric layers 11, positioned between the principal surface 10a1 of the pair of principal surfaces and one of inner electrode layers 12 closest to the principal surface 10a1.

The other of the pair of outer layer portions includes one of the dielectric layers 11, positioned between the principal surface 10a2 of the pair of principal surfaces and one of the inner electrode layers 12 closest to the principal surface 10a2. The inner layer portion is a region sandwiched by the pair of outer layer portions. That is, the inner layer portion includes the plurality of dielectric layers 11 that do not constitute the outer layer portions, and all of the inner electrode layers 12.

It is preferable that the number of laminations of the plurality of dielectric layers 11 is not less than 150 and not more than 200, for example.

It is preferable that the thickness of each of the pair of outer layer portions is not less than about 10 μm and not more than about 22 μm, for example. It is preferable that the thickness of each the plurality of dielectric layers 11 included in the inner layer portion is not less than about 0.6 μm and not more than about 0.8 μm, for example.

The dielectric layer 11 is formed of a perovskite compound containing Ba or Ti. As a material of the dielectric layer 11, a dielectric ceramic mainly composed of $BaTiO_3$ and the like is available. The dielectric layer 11 may be also formed of a material in which an Mg compound, an Mn compound, a Si compound, a V compound, an Al compound, a Zr compound, a rare-earth compound (e.g., $Dy_2O_3$), and the like are added to the main components as a subcomponent.

The dielectric layer 11 contains Ba, Ti, Dy, Mg, Mn, Si, V, Al, and Zr. It is preferable that the content of Dy contained in the dielectric layer 11 is not less than about 1.08 parts by mole and not more than about 1.32 parts by mole based on 100 parts by mole of Ti, for example. When the content of Dy is within the range described above, the reliability of the dielectric layer 11 is sufficiently secured.

It is preferable that the content of Mg contained in the dielectric layer 11 is not less than about 0.351 part by mole and not more than about 0.429 part by mole based on 100 parts by mole of Ti, for example. When the content of Mg is within the range described above, the atomization of grains contained in the dielectric layer is achieved.

It is preferable that the content of V contained in the dielectric layer 11 is not less than about 0.288 part by mole and not more than about 0.35 part by mole based on 100 parts by mole of Ti, for example. When the content of V is within the range described above, the temperature properties of the dielectric layer 11 can be favorably maintained.

It is preferable that the content of Zr contained in the dielectric layer 11 is not more than about 0.04 part by mole based on 100 parts by mole of Ti, for example.

The plurality of inner electrode layers 12 includes a plurality of fourth inner electrode layers 121 connected to an external electrode 20A of the pair of external electrodes, and a plurality of fifth inner electrode layers 122 connected to the other external electrode 20B of the pair of external electrodes.

It is preferable that the number of laminations of the plurality of inner electrode layers 12 is not less than 200 and not more than 400, for example. It is preferable that the thickness of each the plurality of inner electrode layers 12 is not less than about 0.4 μm and not more than about 0.7 μm, for example. It is preferable that a coverage factor at which each of the dielectric layers 11 is covered with the corresponding one of the plurality of inner electrode layers 12 without any space is not less than about 60% and not more than about 80%, for example.

Each of the fourth inner electrode layer 121 and the fifth inner electrode layer 122 preferably has a rectangular or substantially rectangular shape in plan view. The fourth inner electrode layer 121 and the fifth inner electrode layer 122 are alternately disposed in the lamination direction T of the laminate 10 at equal intervals. In addition, the fourth inner electrode layer 121 and the fifth inner electrode layer 122 are disposed so as to face each other across the dielectric layer 11.

The respective fourth inner electrode layer 121 and fifth inner electrode layer 122 include opposite electrode portions that are opposite to each other, and draw-out electrode portions that are drawn from the corresponding opposite electrode portions toward the end surface 10c1 or the end surface 10c2 of the laminate 10. The draw-out electrode portion of the fourth inner electrode layer 121 is drawn from the opposite electrode portion thereof toward the end surface 10c1 of the laminate 10, and the draw-out electrode portion of the fifth inner electrode layer 122 is drawn from the opposite electrode portion thereof toward the end surface 10c2 of the laminate 10.

Each of the dielectric layers 11 included in the inner layer portion is positioned between the opposite electrode portions to generate capacitance, so that the function of a capacitor occurs in this portion.

As a material of the inner electrode layer 12, one kind of metal selected from a group including Ni, Cu, Ag, Pd and Au, or an alloy containing at least one kind of metal selected from the group, is available. As the alloy, an alloy of Ag and Pd is available, for example. The inner electrode layer 12 may contain particles of a dielectric with the same composition base as that of the dielectric ceramic contained in the dielectric layer 11.

The laminate 10 includes a first side-surface-side gap portion positioned between a corresponding one of the opposite electrode portions and the side surface 10b1, and a second side-surface-side gap portion positioned between a corresponding one of the opposite electrode portions and the side surface 10b2, as viewed from the lamination direction T. It is preferable that the size of each of the first side-surface-side gap portion and the second side-surface-side gap portion, in the width direction W, is not less than about 20 μm and not more than about 40 μm, for example.

That is, as viewed from the lamination direction T, a distance between an end of the inner electrode layer 12 positioned on the side surface 10b1 of the pair of side surfaces 10b1 and 10b2 and the side surface 10b1, along the width direction W, and a distance between an end of the fourth inner electrode layer 121 positioned on the side surface 10b2 of the pair of side surfaces 10b1 and 10b2 and the side surface 10b2, along the width direction W, preferably is not less than about 20 μm and not more than about 40 μm, for example.

The laminate 10 includes a first end-surface-side gap portion positioned between the corresponding one of the opposite electrode portions and the end surface 10c1, and a second end-surface-side gap portion positioned between the corresponding one of the opposite electrode portions and the end surface 10c2, as viewed from the lamination direction T. It is preferable that the size of each of the first end-surface-side gap portion and the second end-surface-side gap portion, in the length direction L, is not less than about 30 μm and not more than about 50 μm, for example.

That is, as viewed from the lamination direction T, a distance between an end of the fourth inner electrode layer 121 positioned on the end surface 10c2 of the pair of end surfaces 10c1 and 10c2 and the end surface 10c2, along the length direction L, as well as a distance between an end of the fifth inner electrode layer 122 positioned on the end surface 10c1 and the end surface 10c1, along the length direction L, is not less than about 30 μm and not more than about 50 μm, for example.

The draw-out electrode portion of the fourth inner electrode layer 121 described above is included in the first end-surface-side gap portion, and the draw-out electrode portion of the fifth inner electrode layer 122 is included in the second end-surface-side gap portion.

When a size of each of the first side-surface-side gap portion and the second side-surface-side gap portion in the width direction W, and a size of each of the first end-surface-side gap portion and the second end-surface-side gap portion in the length direction L, is set within the range as described above, the reliability of a multilayer capacitor is able to be secured while downsizing and large-capacity thereof are achieved.

The thickness of each of the plurality of dielectric layers 11 and the thickness of each of the plurality of inner electrode layers 12 can be measured each as an average thickness acquired by a method described below.

First, the section of the laminate 10 perpendicular or substantially perpendicular to the length direction L, the section being exposed by grinding, is observed with a scanning electron microscope. Next, there is measured a thickness of each of the dielectric layers 11 or the inner electrode layers 12 positioned on respective five lines of a total of the center line along the lamination direction T, passing through the center of the section of the laminate 10, and two lines drawn on each of edge portions across the center line at an equal interval. Then, an average value of five measurement values acquired as described above is calculated, and the average value is indicated as an average thickness of the dielectric layers or the inner electrode layers. To acquire a more accurate average thickness, five measurement values as described above are measured in each of an upper portion, a central portion, and a lower portion, in the lamination direction T, and then an average value of the measured values is indicated as an average thickness.

The pair of external electrodes 20A and 20B each are provided such that a portion of the external surface of the laminate 10 is coated therewith. Specifically, the external electrode 20A of the pair of external electrodes is provided from the end surface 10c1 of the pair of end surfaces to the middle of each of the pair of principal surfaces 10a1 and 10a2, and to the middle of each of the pair of side surfaces 10b1 and 10b2.

The external electrode 20B of the pair of external electrodes is provided from the end surface 10c2 of the pair of end surfaces to the middle of each of the pair of principal surfaces 10a1 and 10a2, and to the middle of each of the pair of side surfaces 10b1 and 10b2.

The pair of external electrodes 20A and 20B each include a base electrode layer, a plating layer 23 disposed on the base electrode layer. While a baked layer 21 and a resin layer 22 are provided as the base electrode layer in the present preferred embodiment, the base electrode layer may include at least one of a baked layer, a resin layer, and a thin film layer.

The baked layer 21 is provided on the laminate 10. Specifically, the baked layer 21 included in the external electrode 20A is provided from the end surface 10c1 to the middle of each of the pair of principal surfaces 10a1 and 10*a*2, and to the middle of each of the pair of side surfaces 10*b*1 and 10*b*2. The baked layer 21 included in the external electrode 20B is provided from the end surfaces 10*c*2 to the middle of each of the pair of principal surfaces 10*a*1 and 10*a*2, and to the middle of each of the pair of side surfaces 10*b*1 and 10*b*2.

The baked layer 21 preferably contains glass and metal, for example. A material of the baked layer 21 includes one kind of metal selected from a group including Ni, Cu, Ag, Pd and Au, or an alloy containing the selected metal, and an alloy of Ag and Pd is available, for example. The baked layer 21 may include a plurality of laminated layers. As the baked layer 21, a layer formed by coating and baking conductive paste on the laminate 10, or a layer baked simultaneously with the inner electrode layer 12, may be available. It is preferable that the thickness (maximum thickness) of the baked layer 21 is not less than about 20 μm and not more than about 30 μm, for example.

The resin layer 22 is provided on the external surface of the baked layer 21 such that a leading end side of the baked layer 21 is exposed. The resin layer 22 included in the external electrode 20A is provided from the end surface 10*c*1 to the middle of each of the pair of principal surfaces 10*a*1 and 10*a*2, and to the middle of each of the pair of side surfaces 10*b*1 and 10*b*2. The resin layer 22 included in the external electrode 20B is provided from the end surfaces 10*c*2 to the middle of each of the pair of principal surfaces 10*a*1 and 10*a*2, and to the middle of each of the pair of side surfaces 10*b*1 and 10*b*2.

The resin layer 22 contains conductive particles and a thermosetting resin. The resin layer 22 may include a plurality of laminated layers.

The plating layer 23 is provided such that the resin layer 22 and the baked layer 21 exposed from the resin layer 22 are coated therewith.

The plating layer 23 included in the external electrode 20A is provided from the end surface 10*c*1 to the middle of each of the pair of principal surfaces 10*a*1 and 10*a*2, and to the middle of each of the pair of side surfaces 10*b*1 and 10*b*2. The plating layer 23 included in the external electrode 20B is provided from the end surfaces 10*c*2 to the middle of each of the pair of principal surfaces 10*a*1 and 10*a*2, and to the middle of each of the pair of side surfaces 10*b*1 and 10*b*2.

A material of the plating layer 23 includes one kind of metal selected from a group including Ni, Cu, Ag, Pd and Au, or an alloy containing the selected metal, and an alloy of Ag and Pd is available, for example.

The plating layer 23 may include a plurality of laminated layers. In this case, it is preferable that the plating layer 23 has a two-layer structure in which a Sn plating layer is provided on a Ni plating layer. The Ni plating layer prevents a base electrode layer from being eroded by solder used when a ceramic electronic component is mounted. The Sn plating layer enhances solder wettability when a ceramic electronic component is mounted to facilitate mounting of the ceramic electronic component. It is preferable that the thickness of the plating layer per layer is not less than about 2.0 μm and not more than about 6.0 μm, for example.

The plating layer 23 also may include a first plating layer and a second plating layer as a two-layer structure other than the two-layer structure described above.

The first plating layer and the second plating layer are composed of one kind of metal selected from a group including Cu, Ni, Sn, Pb, Au, Ag, Pd, Bi and Zn, or an alloy containing the selected metal, for example.

For example, when Ni is used as an inner electrode, it is preferable to use Cu including good bondability with Ni for the first plating layer. In addition, it is preferable to use Sn or A including good solder wettability for the second plating layer. For the first plating layer, Ni including solder barrier performance may be used.

The second plating layer is formed as needed, so that the plating layer 23 may include only the first plating layer. The second plating layer may be provided as an outermost layer of the plating layer 23, and another plating layer may be provided on the second plating layer.

It is preferable that a plating layer does not contain glass. The plating layer preferably has a metal ratio of about 99 volume % or more, for example.

As illustrated in FIG. 4, on the pair of principal surfaces 10*a*1 and 10*a*2 on an end surface 10*c*1 side, a length L11 of the resin layer 22 from the end surface 10*c*1 to its leading end along the length direction L is shorter than a length L12 of the baked layer 21 from the end surface 10*c*1 to its leading end along the length direction.

While there is no illustration in FIG. 4, also on the pair of side surfaces 10*b*1 and 10*b*2 on the end surface 10*c*1 side, a length of the resin layer 22 from the end surface 10*c*1 to its leading end along the length direction L preferably is shorter than a length of the baked layer 21 from the end surface 10*c*1 to its leading end along the length direction.

Likewise, while there is no illustration in FIG. 4, on the pair of principal surfaces 10*a*1 and 10*a*2 also on an end surface 10*c*2 side, a length of the resin layer 22 from the end surface 10*c*2 to its leading end along the length direction L preferably is shorter than a length of the baked layer 21 from the end surface 10*c*2 to its leading end along the length direction.

In addition, also on the pair of side surfaces 10*b*1 and 10*b*2 on the end surface 10*c*2 side, a length of the resin layer 22 from the end surface 10*c*2 to its leading end along the length direction L preferably is shorter than a length of the baked layer 21 from the end surface 10*c*2 to its leading end along the length direction.

The plating layer 23 is provided such that the resin layer 22 and a portion of the baked layer 21 exposed from the resin layer 22 are coated therewith. This causes a step to be formed in a portion of the plating layer 23, corresponding to a boundary between the resin layer 22 and the baked layer 21.

The leading end of the plating layer 23 is brought into contact with the external surface of the laminate 10 by exceeding the leading end of the baked layer 21. Specifically, the leading end of the plating layer 23 is brought into contact with the pair of principal surfaces 10*a*1 and 10*a*2, and the pair of side surfaces 10*b*1 and 10*b*2.

On the pair of principal surfaces 10*a*1 and 10*a*2 on the end surface 10*c*1 side, a length L13 of the plating layer 23 from the end surface 10*c*1 to its leading end along the length direction L is longer than the length L12 of the baked layer 21 from the end surface 10*c*1 to its leading end along the length direction L.

On the pair of side surfaces 10*b*1 and 10*b*2 on the end surface 10*c*1 side, a length of the plating layer 23 from the end surface 10*c*1 to its leading end along the length direction L is longer than a length of the baked layer 21 from the end surface 10*c*1 to its leading end along the length direction L.

On the pair of principal surfaces 10*a*1 and 10*a*2 on the end surface 10*c*2 side, a length of the plating layer 23 from the end surface 10*c*2 to its leading end along the length direction L is longer than a length of the baked layer 21 from the end surface 10*c*2 to its leading end along the length direction L.

On the pair of side surfaces 10b1 and 10b2 on the end surface 10c2 side, a length of the plating layer 23 from the end surface 10c2 to its leading end along the length direction L is longer than a length of the baked layer 21 from the end surface 10c2 to its leading end along the length direction L.

The baked layer 21 is coated with the resin layer 22, and thus is protected from moisture seeping through the external electrodes. The multilayer ceramic capacitor is mounted in a very limited space, so that it is preferable to form the resin layer 22 as thin as possible. The resin layer 22 can be thinly formed by reducing a distance from the end surface to the leading end of the resin layer 22 along the length direction L.

Figure 5:
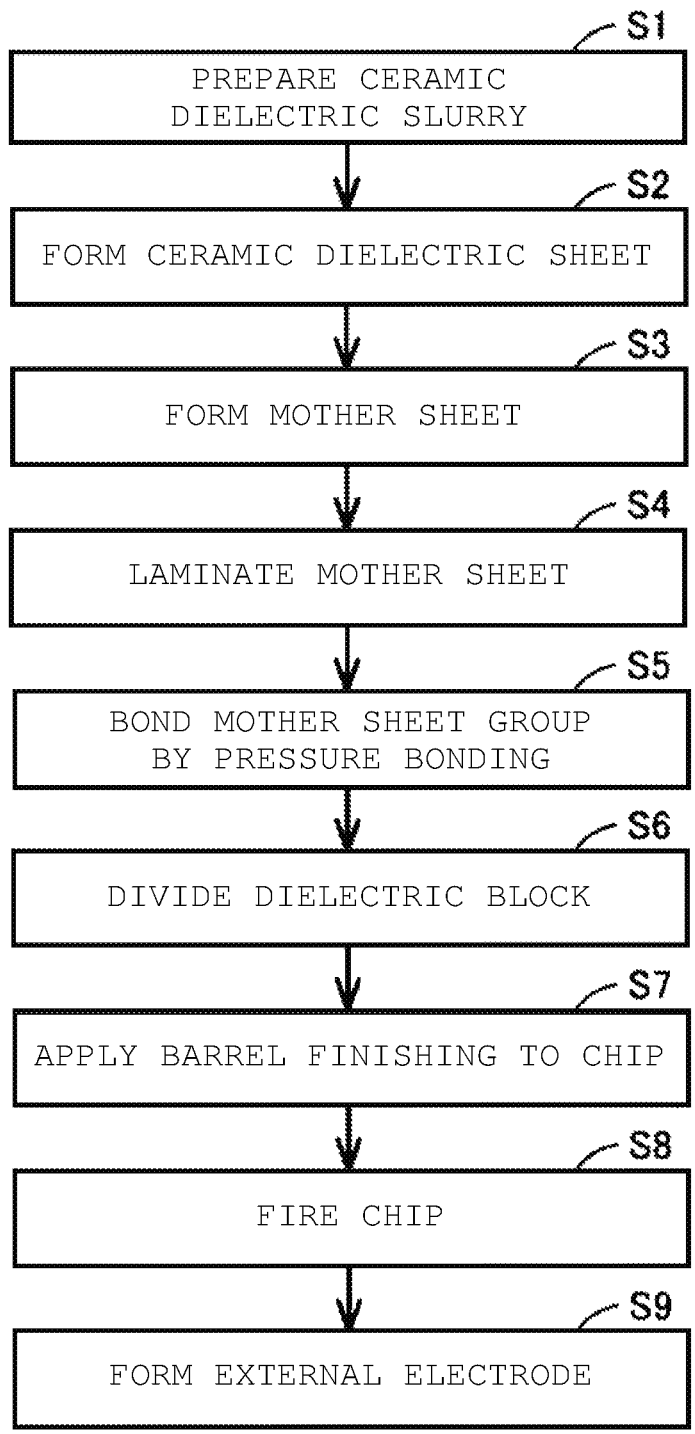
FIG. 5 is a flowchart showing a manufacturing flow of the multilayer ceramic capacitor according to a preferred embodiment of the present invention.

FIG. 5 is a flowchart showing a non-limiting example of a manufacturing flow of a multilayer ceramic capacitor according to a preferred embodiment of the present invention. With reference to FIG. 5, a method for manufacturing the multilayer ceramic capacitor according to the present preferred embodiment will be described.

As shown in FIG. 5, when the multilayer ceramic capacitor 1C of the present preferred embodiment is manufactured, first ceramic dielectric slurry is prepared (step S1). Specifically, ceramic dielectric powder, addition powder, binder resin, solvent, and the like are mixed, so that the ceramic dielectric slurry is prepared.

More specifically, first powder of each of high-purity $BaCO_3$ and $TiO_2$ is prepared as a starting material of $BaTiO_3$ being a main component. After the prepared powder is mixed by wet blending using a ball mill to be uniformly dispersed, dryness processing is applied to the prepared powder to acquire adjusted powder. The adjustment powder is calcined at temperature from about 1000° C. to about 1200° C. to acquire main component powder.

Meanwhile, powder of each of $Al_2O_3$, $SiO_2$, $MgCO_3$, $Dy_2O_3$, $MnO_2$, $V_2O_5$, and $ZrO_2$ is prepared as a sub-component.

Next, the powder of each of $Al_2O_3$, $SiO_2$, $MgCO_3$, $Dy_2O_3$, $MnO_2$, $V_2O_5$, and $ZrO_2$ is weighed so that the content of each of Al, Si, Mg, Dy, Mn, V, and Zr with respect to Ti becomes a predetermined value. Then the powder of each of them is added to the main component powder acquired as described above to acquire mixed powder.

Subsequently, after the mixed powder is mixed by wet blending using the ball mill to be uniformly dispersed, dryness processing is applied to the mixed powder to acquire a ceramic raw material composed of ceramic dielectric powder and addition powder. Then, a polyvinyl butyral based binder and ethanol as plasticizer and organic solvent are added to the ceramic raw material, and mixed by wet blending using the ball mill to form ceramic slurry.

Subsequently, a ceramic dielectric sheet is formed (step S2). Specifically, ceramic dielectric slurry is molded in the shape of a sheet on a carrier film by using a die coater, a gravure coater, or a micro gravure coater, for example, and is then dried, so that the ceramic dielectric sheet is formed.

Subsequently, a mother sheet is formed (step S3). Specifically, conductive paste is applied to the ceramic dielectric sheet so as to have a predetermined pattern, so that the mother sheet including the ceramic dielectric sheet that is provided with a predetermined inner electrode pattern thereon is formed. As the mother sheet, a ceramic dielectric sheet that does not pass through step S3 described above is prepared along with the mother sheet provided with the inner electrode pattern.

Subsequently, the mother sheet is laminated (step S4). Specifically, a predetermined number of mother sheets provided with no inner electrode pattern is laminated. On the laminated mother sheets, the mother sheet including the ceramic dielectric sheet that is provided with the inner electrode pattern thereon is sequentially laminated. Further on the laminated mother sheets, a predetermined number of mother sheets provided with no inner electrode pattern is laminated. Thus, a group of mother sheets is formed.

Subsequently, the mother sheet group is bonded by pressure bonding (step S5). Specifically, the mother sheet group is pressed in the lamination direction by isostatic pressing or rigid body pressing to be bonded. Thus, a dielectric block is formed.

Subsequently, the dielectric block is divided (step S6). Specifically, the dielectric block is divided in a matrix form by pressing and cutting, or dicing. This allows the dielectric block to be divided into a plurality of individual chips.

Subsequently, barrel finishing is applied to the chips (step S7). Specifically, the chips are put into a small box called a barrel together with media balls with hardness more than that of dielectric material, and then the barrel is rotated to grind the chips. This allows a corner and a ridge line portion of each of the chips to be rounded.

Subsequently, each of the chips is fired (step S8). Specifically, the chip is heated to fire a dielectric material and a conductive material contained therein, so that a laminate 10 is formed. While the firing temperature is appropriately set depending on the dielectric material and the conductive material, it is preferably not less than about 900° C. and not more than about 1300° C., for example.

Subsequently, each of external electrodes is formed (step S9). Specifically, a baked layer 21, a resin layer 22, and a plating layer 23 are formed on the laminate 10 in this order.

When the baked layer 21 is formed, conductive paste is applied such that a pair of end surfaces 10c1 and 10c2 of the laminate 10 is coated therewith, and that the conductive paste reaches to the middle of each of a pair of principal surfaces 10a1 and 10a2, and to the middle of each of a pair of side surfaces 10b1 and 10b2, and then the conductive paste is burned. Thus, the baked layer 21 is formed. It is preferable that the burning temperature is not less than about 700° C. and not more than about 900° C., for example.

When the resin layer 22 is formed, conductive resin paste is applied to the external surface of the baked layer 21 such that a leading end of the baked layer 21 positioned on each of the pair of principal surfaces 10a1 and 10a2, as well as on each of the pair of side surfaces 10b1 and 10b2, is exposed, and then heat treatment is applied to the conductive resin paste. It is preferable that the heat treatment temperature is not less than about 250° C. and not more than about 550° C., for example.

When the plating layer is formed, plating containing Ni and plating containing Sn are applied such that the resin layer 22 and a portion of the baked layer 21 exposed from the resin layer 22 are coated therewith in the order described above. Thus, the plating layer 23 is formed. As a result, a pair of external electrodes 20A and 20B is formed on the external surface of the laminate 10.

The multilayer ceramic capacitor 1C of the present preferred embodiment can be manufactured through the series of steps described above.

FIG. 6 is a table showing results of reliability evaluation, temperature property evaluation, and atomization evaluation of multilayer ceramic capacitors according to examples and comparative examples. With reference to FIG. 6, the reliability evaluation, the temperature property evaluation, and the atomization evaluation, which are performed for the multilayer ceramic capacitors according to the examples and the comparative examples, will be described.

Multilayer ceramic capacitors according to the comparative examples 1 to 8 and multilayer ceramic capacitors according to the examples 1 to 16 were manufactured in accordance with the method for manufacturing the multilayer ceramic capacitor according to the present preferred embodiment. The reliability evaluation, the temperature property evaluation, and the atomization evaluation were performed for the multilayer ceramic capacitors according to the comparative examples 1 to 8 and the examples 1 to 16.

When the multilayer ceramic capacitors according to the comparative examples 1 to 8 and the examples 1 to 16 were manufactured, a mixing amount of main component powder and sub-component powder was adjusted in step S1 to vary various contents based on 100 parts by mole of Ti, such as a Dy content, a Mg content, a Mn content, and a V content.

The content of each element was measured through ICP analysis by applying solution treatment to the laminate after applying dissolution treatment to the laminate by using a solvent. Thus, a measurement value does not depend on where each element exists in the laminate. That is, a composition (a content of each element) of a dielectric layer determined as described above may indicate a composition of the laminate. The composition (the content of each element) of the dielectric layer determined as described above may also indicate a composition in the case where the laminate is dissolved in a solvent to form a solution. As a method of forming a solution, an alkali melting method is used, for example.

As the reliability evaluation, it was confirmed whether IR deterioration occurred by applying a voltage corresponding to twice the rated voltage to a multilayer ceramic capacitor for 12 hours under high humidity and high temperature environment where temperature was 85° C. and humidity was 85%. A case where IR deterioration occurs indicates a case where an IR value rapidly decreases as compared with an initial value, and more particularly, a case where an IR value decreases to about 1/10 or less of the initial value and a case where a multilayer ceramic capacitor does not operate. The case where IR deterioration occurs was evaluated as "NG", and a case where no IR deterioration occurs was evaluated as "G".

As the temperature property evaluation, it was confirmed whether an X5R property of EIA standard (a temperature variation rate of capacitance is within ±15% with respect to capacitance at +25° C. within a temperature range from −55° C. to +85° C.) was satisfied. A case where the X5R property was not satisfied was evaluated as "NG", and a case where the X5R property was satisfied was evaluated as "G".

As the atomization evaluation, it was confirmed whether atomization of grains contained in a dielectric layer was obstructed by observing a section of the dielectric layer with SEM. A case where the atomization of grains was obstructed was evaluated as "NG", and a case where the atomization of grains was not obstructed was evaluated as "G".

In the multilayer ceramic capacitor according to the comparative example 1, the reliability evaluation was "NG". In the multilayer ceramic capacitor according to the comparative example 2, the reliability evaluation was "NG". In the multilayer ceramic capacitor according to the comparative example 3, the atomization evaluation was "NG". In the multilayer ceramic capacitor according to the comparative example 4, the atomization evaluation was "NG". In the multilayer ceramic capacitor according to each of the comparative examples 5 to 8, the temperature property evaluation was "NG".

In the multilayer ceramic capacitor according to each of the examples 1 to 16, all of the reliability evaluation, the temperature property evaluation, and the atomization evaluation were "G".

From the results described above, it can be said that there is an experimentally verified fact that the reliability is sufficiently secured when the content of Dy contained in the dielectric layer 11 is not less than about 1.08 parts by mole and not more than about 1.32 parts by mole based on 100 parts by mole of Ti, for example.

In addition, it can be said that there is an experimentally verified fact that the atomization of grains contained in the dielectric layer is achieved when the content of Mg contained in the dielectric layer 11 is not less than about 0.351 part by mole and not more than about 0.429 part by mole based on 100 parts by mole of Ti, for example.

Further, it can be said that there is an experimentally verified fact that the temperature property can be favorably maintained when the content of V contained in the dielectric layer 11 is not less than about 0.288 part by mole and not more than about 0.35 part by mole based on 100 parts by mole of Ti, for example.

FIGS. 7 to 10 respectively illustrate first to fourth examples in each of which a plurality of multilayer ceramic capacitors is mounted on the mounting substrate according to the present preferred embodiment. With reference to FIGS. 7 to 10, a mounting substrate 100 according to the present preferred embodiment will be described.

The mounting substrate 100 according to the present preferred embodiment is provided to allow a multilayer ceramic capacitor 1A as a first electronic component, a multilayer ceramic capacitor 1B as a second electronic component, and a multilayer ceramic capacitor 1C as a third electronic component, to be mounted thereon. For example, a printed circuit board can be used for the mounting substrate 100. The mounting substrate 100 includes a land at a desired position suitable for a multilayer ceramic capacitor to be mounted, so that the land and an external electrode of the multilayer ceramic capacitor are electrically connected to each other by a fillet formed when molten solder is solidified.

The multilayer ceramic capacitor 1A and the multilayer ceramic capacitor 1B each have a structure that is identical or substantially identical to that of the multilayer ceramic capacitor 1C. The multilayer ceramic capacitor 1A and the multilayer ceramic capacitor 1B are different from the multilayer ceramic capacitor 1C in an outline dimension, so that there are differences in the number of laminated dielectric layers as well as in the number of laminated inner electrode layers, for example.

The multilayer ceramic capacitor 1A includes: a first laminate that includes a plurality of first dielectric layers and a plurality of first inner electrode layers, which are laminated, and that includes a pair of first principal surfaces facing each other in a lamination direction, a pair of first side surfaces facing each other in a width direction perpendicular or substantially perpendicular to the lamination direction, and a pair of first end surfaces facing each other in a length direction perpendicular or substantially perpendicular to the lamination direction and the width direction; and a pair of first external electrodes each extending from a corresponding one of the pair of first end surfaces to the portion of the pair of first principal surfaces and to the portion of the pair of first side surfaces.

The multilayer ceramic capacitor 1B includes: a second laminate that includes a plurality of second dielectric layers and a plurality of second inner electrode layers, which are laminated, and that includes a pair of second principal surfaces facing each other in a lamination direction, a pair of second side surfaces facing each other in a width direction perpendicular or substantially perpendicular to the lamination direction, and a pair of second end surfaces facing each other in a length direction perpendicular or substantially perpendicular to the lamination direction and the width direction; and a pair of second external electrodes each extending from a corresponding one of the pair of second end surfaces to the portion of the pair of second principal surfaces and to the portion of the pair of second side surfaces.

When a dimension of the multilayer ceramic capacitor 1A in the length direction is designated as L1, a dimension of the multilayer ceramic capacitor 1B in the width direction is designated as W1, a dimension of the multilayer ceramic capacitor 1B in the length direction is designated as L2, and a dimension of the multilayer ceramic capacitor 1B in the width direction is designated as W2, a dimension of the multilayer ceramic capacitor 1C in the width direction is any one of W1 and W2. A dimension of the multilayer ceramic capacitor 1C in the length direction is L2 when the dimension of the multilayer ceramic capacitor 1C in the width direction is W1, and is L1 when the dimension of the multilayer ceramic capacitor 1C in the width direction is W2.

In the present preferred embodiment, there is described the multilayer ceramic capacitor 1C that includes a width of W1, and a length of L2, for example.

For example, the dimension L1 of the multilayer ceramic capacitor 1A in the length direction is about 0.4 mm±20%, the dimension W1 of the multilayer ceramic capacitor 1A in the width direction is about 0.2 mm±20%, and a dimension T1 of the multilayer ceramic capacitor 1A in a height direction is about 0.2 mm±20%, for example.

For example, the dimension L2 of the multilayer ceramic capacitor 1B in the length direction is about 0.6 mm±20%, the dimension W2 of the multilayer ceramic capacitor 1B in the width direction is about 0.3 mm±20%, and a dimension T2 of the multilayer ceramic capacitor 1B in the height direction is about 0.3 mm±20%, for example.

For example, the dimension of the multilayer ceramic capacitor 1C in the length direction is about 0.4 mm±20% that is the same as the L1, the dimension of the multilayer ceramic capacitor 1C in the width direction is about 0.3 mm±20% that is the same as the W2, and a dimension of the multilayer ceramic capacitor 1C in a height direction is about 0.4 mm±20%, for example.

Each dimension of the multilayer ceramic capacitor 1A, the multilayer ceramic capacitor 1B, and the multilayer ceramic capacitor 1C can be measured by using a micrometer or an optical microscope.

As illustrated in FIGS. 7 to 10, the mounting substrate 100 includes a pair of first edge portions 101 facing each other, and a pair of second edge portions 102 that is perpendicular or substantially perpendicular to the pair of first edge portions 101 and faces each other.

A length L3 of each of the first edge portions 101 is the least common multiple of the L1 and the L2, for example. A length W3 of each of the second edge portions 102 is the least common multiple of the W1 and the W2, for example.

The length L3 of each of the first edge portions 101 and the length W3 of each of the second edge portions 102 are not limited to the above least common multiples, and some differences from the respective least common multiples may be allowed.

While a mounting example in which a plurality of multilayer ceramic capacitors is mounted on a mounting substrate will be described below, the mounting example is not limited to that described below.

As described above, when the length W3 of each of the first edge portions 101 is the least common multiple of the W1 and the W2, and the length L3 of each of the second edge portions 102 is the least common multiple of the L1 and the L2, the number W3/W1 of multilayer ceramic capacitors 1C can be disposed along a direction parallel or substantially parallel to each of the first edge portions 101 at the maximum if the multilayer ceramic capacitor 1C has the dimension W1 in the width direction W, which is the same as that of the multilayer ceramic capacitor 1A, and has the dimension L2 in the length direction L, which is the same as that of the multilayer ceramic capacitor 1B. In addition, the number L3/L2 of multilayer ceramic capacitors 1C can be disposed along a direction parallel or substantially parallel to each of the second edge portions 102 at the maximum.

Figure 7:
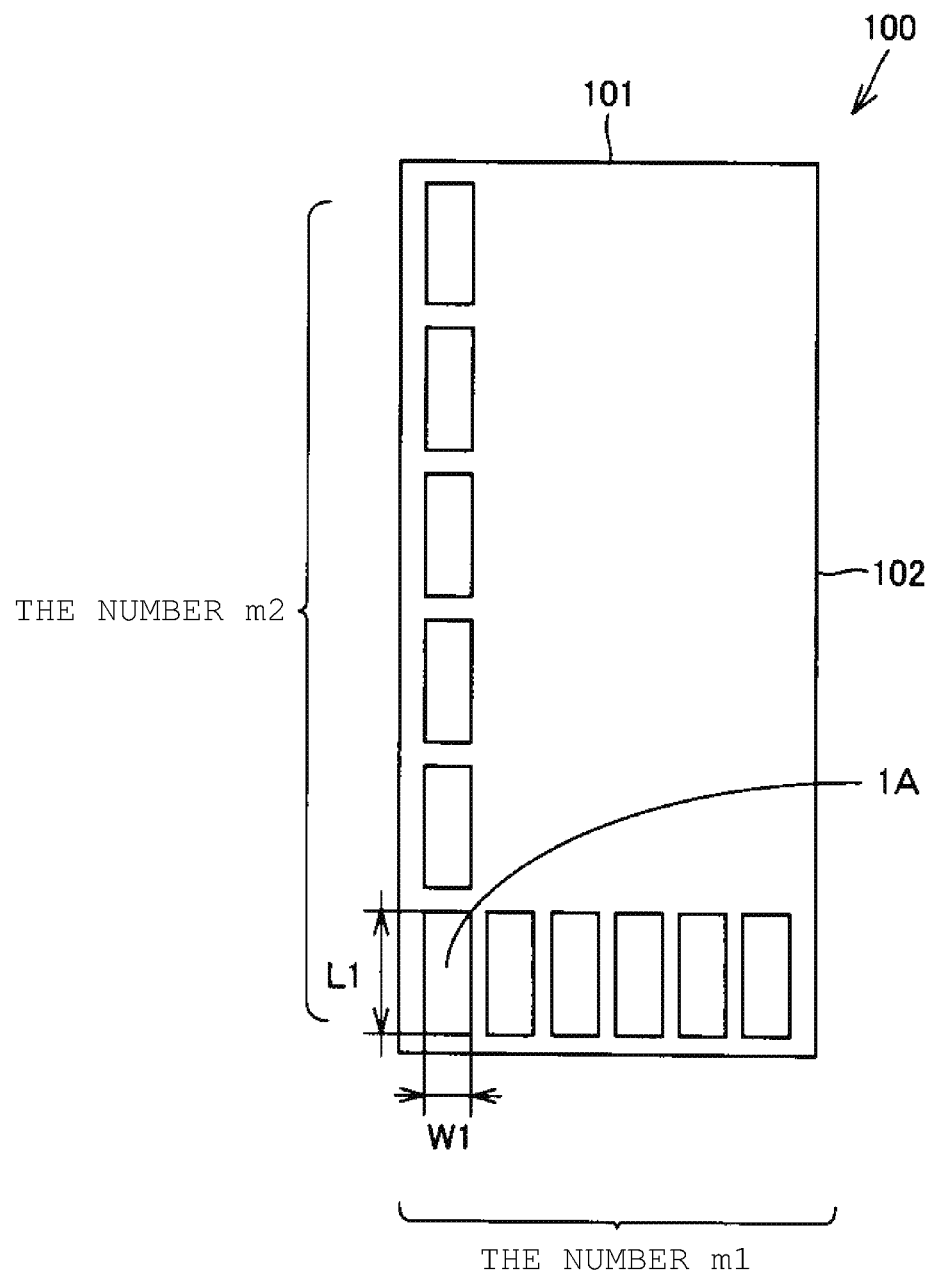
FIG. 7 illustrates a first mounting example in which a plurality of multilayer ceramic capacitors is mounted on a mounting substrate according to a preferred embodiment of the present invention.

FIG. 7 illustrates a first mounting example in which a plurality of multilayer ceramic capacitors is mounted on a mounting substrate according to the present preferred embodiment. As illustrated in FIG. 7, the first mounting example shows the mounting substrate 100 on which only the multilayer ceramic capacitor 1A as a first electronic component is mounted.

The mounting substrate 100 includes the pair of first edge portions 101 facing each other, and the pair of second edge portions 102 that is perpendicular or substantially perpendicular to the pair of first edge portions 101 and that faces each other.

When only a plurality of multilayer ceramic capacitors 1A is disposed along the direction parallel or substantially parallel to each of the first edge portions 101 to allow the pair of first edge portions 101 and the width direction of each of the multilayer ceramic capacitors 1A to be parallel or substantially parallel to each other as viewed from the normal direction of the mounting substrate 100, the number m1 of multilayer ceramic capacitors 1A can be disposed on the mounting substrate 100.

When only a plurality of multilayer ceramic capacitors 1A is disposed along the direction parallel or substantially parallel to each of the second edge portions 102 to allow the pair of second edge portions 102 and the length direction of the multilayer ceramic capacitor 1A to be parallel or substantially parallel to each other as viewed from the normal direction of the mounting substrate 100, the number m2 of multilayer ceramic capacitors 1A can be disposed on the mounting substrate 100.

Figure 8:
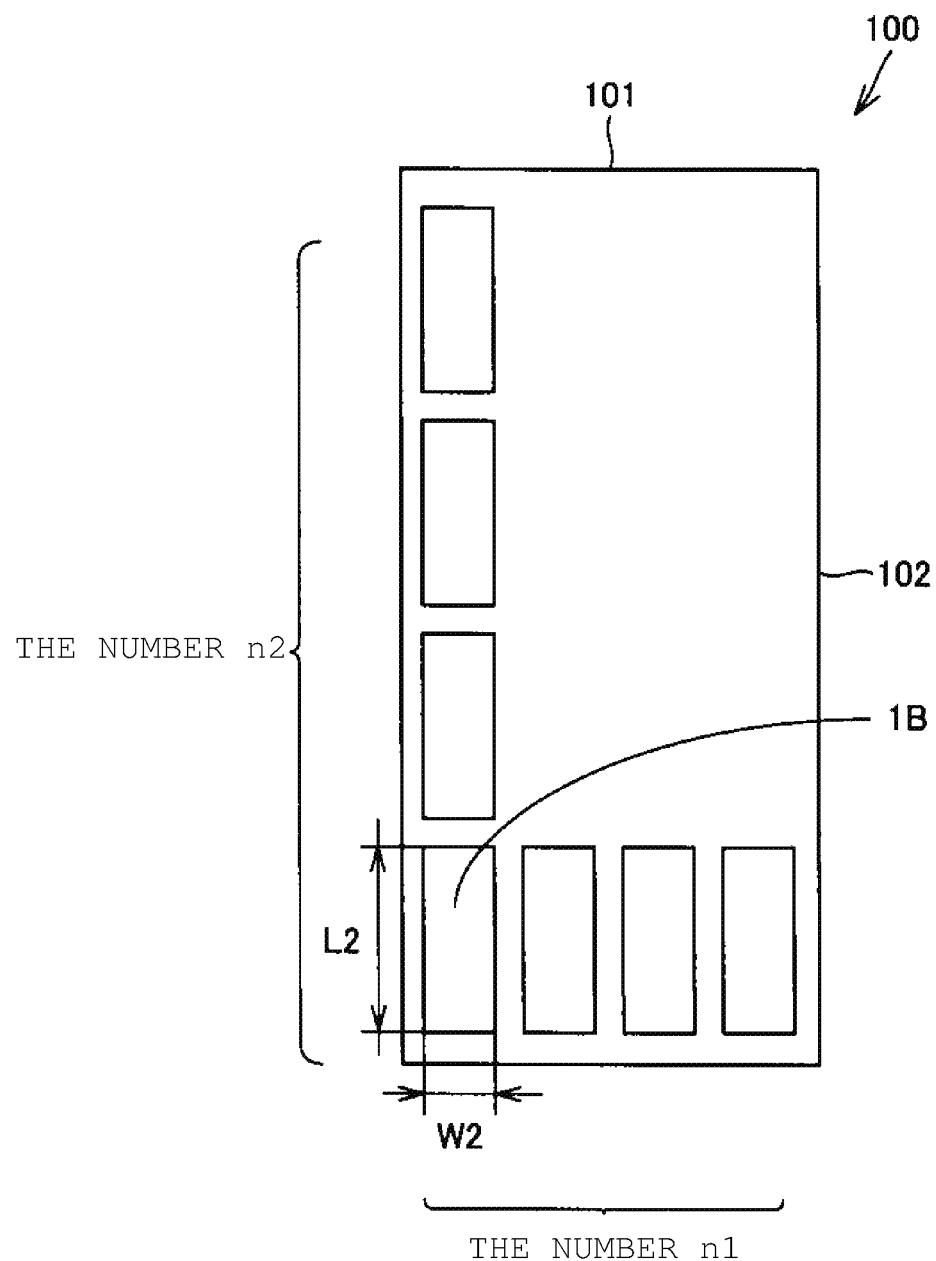
FIG. 8 illustrates a second mounting example in which a plurality of multilayer ceramic capacitors is mounted on the mounting substrate according to a preferred embodiment of the present invention.

FIG. 8 illustrates a second mounting example in which a plurality of multilayer ceramic capacitors is mounted on the mounting substrate according to the present preferred embodiment. As illustrated in FIG. 8, the second mounting example shows the mounting substrate 100 on which only the multilayer ceramic capacitor 1B as a second electronic component is mounted.

When only a plurality of multilayer ceramic capacitors 1B is disposed along the direction parallel or substantially parallel to each of the first edge portions 101 to allow the pair of first edge portions 101 and the width direction of each of the multilayer ceramic capacitors 1B to be parallel or substantially parallel to each other as viewed from the normal direction of the mounting substrate 100, the number n1 of multilayer ceramic capacitors 1B can be disposed on the mounting substrate 100.

When only a plurality of multilayer ceramic capacitors 1B is disposed along the direction parallel or substantially parallel to each of the second edge portions 102 to allow the pair of second edge portions 102 and the length direction of the multilayer ceramic capacitor 1B to be parallel or substantially parallel to each other as viewed from the normal direction of the mounting substrate 100, the number n2 of multilayer ceramic capacitors 1B can be disposed on the mounting substrate 100.

It is preferable that m1 and n1 are a combination of integers to allow a ratio of m1 to n1 to be an inverse ratio of W1 to W2, and the minimum combination of integers is more preferable.

As described above, when W1 is about 0.2 mm and W2 is about 0.3 mm, it is preferable that m1 and n1 form a combination of integers satisfying an inverse ratio of 3:2, for example.

For example, it is preferable that m1 is 6 and n1 is 4, as illustrated in FIGS. 7 and 8. It is more preferable that m1 is 3 and n1 is 2. Minimizing the number of each of m1 and n1 enables the mounting substrate 100 to be further reduced in size.

Likewise, it is preferable that m2 and n2 are a combination of integers to allow a ratio of m2 to n2 to be an inverse ratio of L1 to L2, and the minimum combination of integers is more preferable.

As described above, when L1 is about 0.4 mm and L2 is about 0.6 mm, it is preferable that m1 and n1 form a combination of integers satisfying an inverse ratio of 3:2, for example.

For example, it is preferable that m2 is 6 and n2 is 4, as illustrated in FIGS. 7 and 8. It is more preferable that m2 is 3 and n2 is 2. Minimizing the number of each of m2 and n2 enables the mounting substrate 100 to be further reduced in size.

Figure 9:
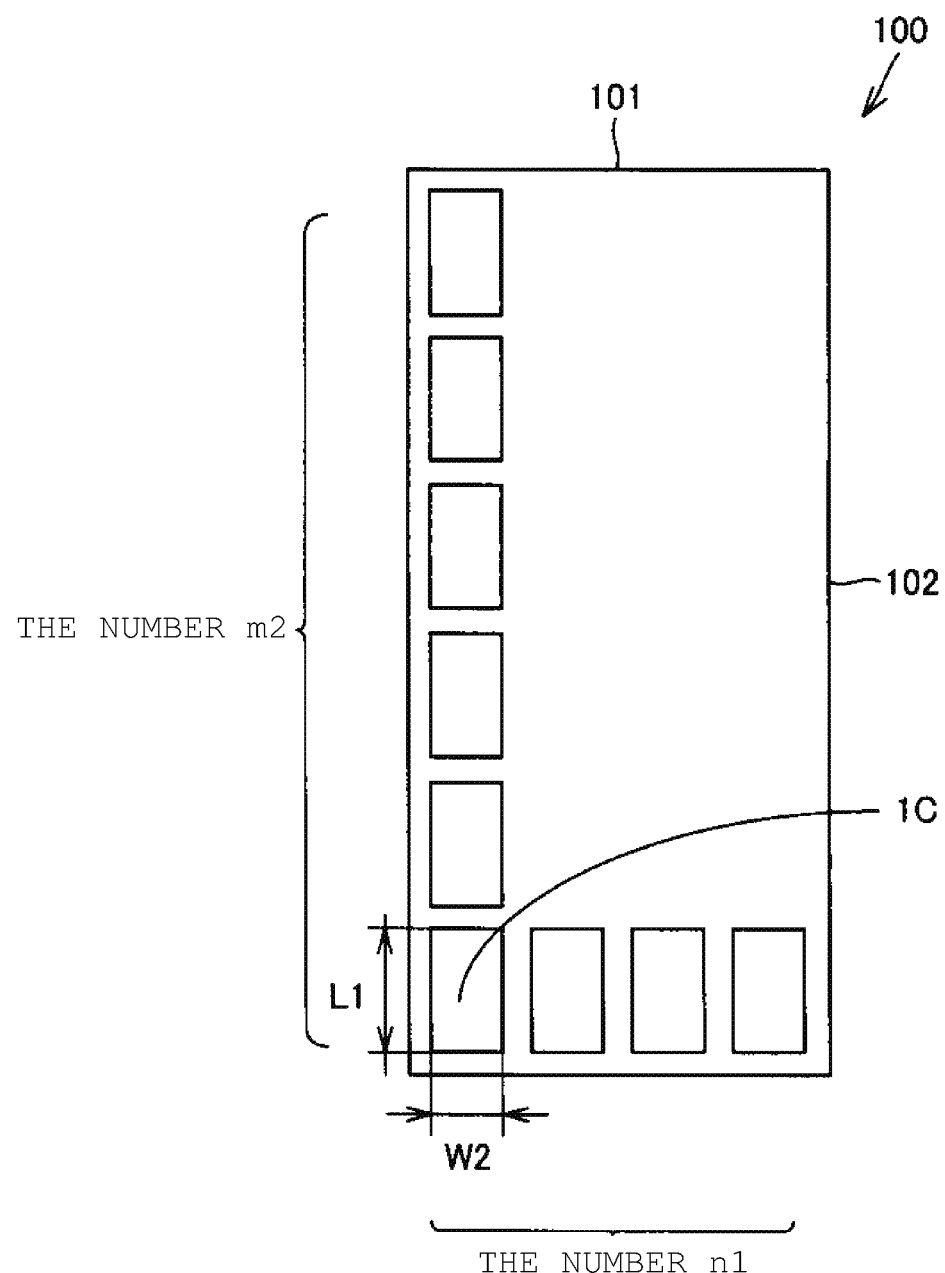
FIG. 9 illustrates a third mounting example in which a plurality of multilayer ceramic capacitors is mounted on the mounting substrate according to the preferred embodiment of the present invention.

FIG. 9 illustrates a third mounting example in which a plurality of multilayer ceramic capacitors is mounted on the mounting substrate according to the present preferred embodiment. As illustrated in FIG. 9, the third mounting example shows the mounting substrate 100 on which only the multilayer ceramic capacitor 1C as a third electronic component is mounted.

The multilayer ceramic capacitor 1C has the dimension L1 in the length direction L, which is the same as that of the multilayer ceramic capacitor 1A, and the dimension W2 in the width direction W, which is the same as that of the multilayer ceramic capacitor 1B. Thus, when only a plurality of multilayer ceramic capacitors 1C is disposed along the direction parallel or substantially parallel to each of the first edge portions 101 to allow the pair of first edge portions 101 and the width direction of each of the multilayer ceramic capacitors 1C to be parallel or substantially parallel to each other as viewed from the normal direction of the mounting substrate 100, the number n1 of multilayer ceramic capacitors 1C can be disposed on the mounting substrate 100.

When only a plurality of multilayer ceramic capacitors 1C is disposed along the direction parallel or substantially parallel to each of the second edge portions 102 to allow the pair of second edge portions 102 and the length direction of the multilayer ceramic capacitor 1C to be parallel or substantially parallel to each other as viewed from the normal direction of the mounting substrate 100, the number m2 of multilayer ceramic capacitors 1C can be disposed on the mounting substrate 100.

Figure 10:
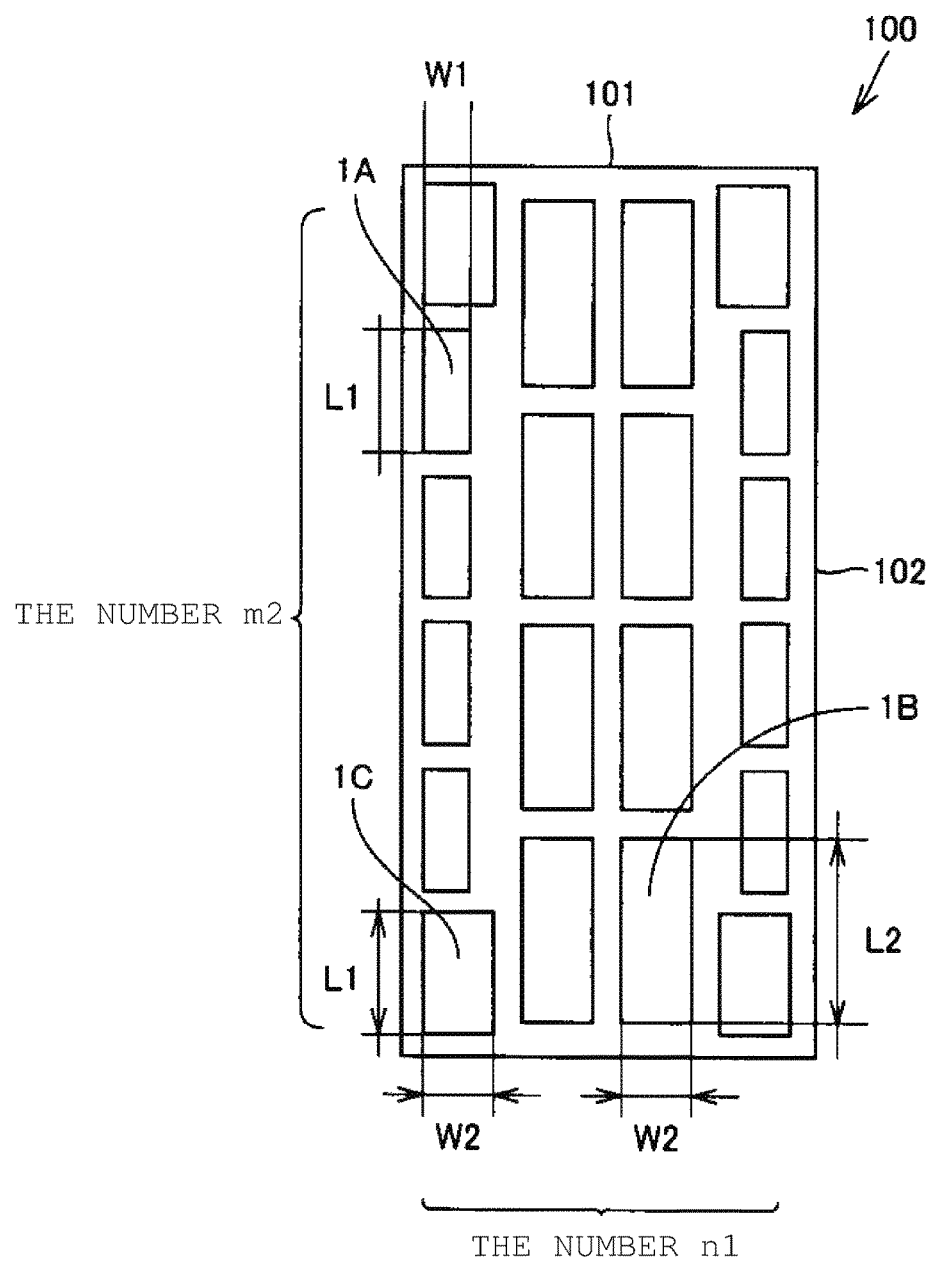
FIG. 10 illustrates a fourth mounting example in which a plurality of multilayer ceramic capacitors is mounted on the mounting substrate according to a preferred embodiment of the present invention.

FIG. 10 illustrates a fourth mounting example in which a plurality of multilayer ceramic capacitors is mounted on the mounting substrate according to the present preferred embodiment. As illustrated in FIG. 10, the fourth mounting example shows the mounting substrate 100 on which all of the multilayer ceramic capacitor 1A, the multilayer ceramic capacitor 1B, and the multilayer ceramic capacitor 1C are mounted.

As described above, the multilayer ceramic capacitor 1C has the dimension L1 in the length direction L, which is the same as that of the multilayer ceramic capacitor 1A, and the dimension W2 in the width direction W, which is the same as that of the multilayer ceramic capacitor 1B.

Thus, when a plurality of multilayer ceramic capacitors 1B and a plurality of multilayer ceramic capacitors 1C are disposed along the direction parallel or substantially parallel to each of the first edge portions 101 to allow the pair of first edge portions 101 and the width direction of each of the multilayer ceramic capacitors 1B as well as the width direction of each of the multilayer ceramic capacitors 1C to be parallel or substantially parallel to each other as viewed from the normal direction of the mounting substrate 100, the total number n1 of multilayer ceramic capacitors 1B and multilayer ceramic capacitors 1C can be disposed on the mounting substrate 100.

In addition, when a plurality of multilayer ceramic capacitors 1A and a plurality of multilayer ceramic capacitors 1C are disposed along the direction parallel or substantially parallel to each of the first edge portions 101 to allow the pair of second edge portions 102, and the length direction of each of the multilayer ceramic capacitors 1A as well as the length direction of each of the multilayer ceramic capacitors 1C to be parallel or substantially parallel to each other as viewed from the normal direction of the mounting substrate 100, the total number m2 of multilayer ceramic capacitors 1A and multilayer ceramic capacitors 1C can be disposed on the mounting substrate 100.

As described above, a length of each of the first edge portions 101 and a length of each of the second edge portions 102 of the mounting substrate 100 are defined on the basis of the dimension W1 of the multilayer ceramic capacitor 1A in the width direction, the dimension L1 of the multilayer ceramic capacitor 1A in the length direction, the dimension W2 of the multilayer ceramic capacitor 1B in the width direction, and the dimension L2 of the multilayer ceramic capacitor 1B in the length direction, and the dimension of the multilayer ceramic capacitor 1C in the width direction as well as the dimension thereof in the length direction is determined, so that the multilayer ceramic capacitors 1C can be efficiently mounted on the mounting substrate 100 when mounted on the mounting substrate 100. In addition, even when at least any one of the multilayer ceramic capacitor 1A, the multilayer ceramic capacitor 1B, and the multilayer ceramic capacitor 1C is mounted, such as when all of the multilayer ceramic capacitor 1A, the multilayer ceramic capacitor 1B, and the multilayer ceramic capacitor 1C are mounted, instead of mounting only the multilayer ceramic capacitor 1C, the multilayer ceramic capacitors can be efficiently mounted on the mounting substrate 100.

The dielectric layer 11 of the multilayer ceramic capacitor 1C contains Ba, Ti, Dy, Mg, Mn, Si, V, Al, and Zr. When the content of Dy contained in the dielectric layer 11 is set at not less than about 1.08 parts by mole and not more than about 1.32 parts by mole based on 100 parts by mole of Ti, the reliability of the multilayer ceramic capacitor 1C is able to be sufficiently secured as described above. When the content of Mg contained in the dielectric layer 11 is set at not less than about 0.351 part by mole and not more than about 0.429 part by mole based on 100 parts by mole of Ti, the atomization of grains contained in the dielectric layer 11 is achieved as described above. When the content of V contained in the dielectric layer 11 is set at not less than about 0.288 part by mole and not more than about 0.35 part by mole based on 100 parts by mole of Ti, the temperature property of the multilayer ceramic capacitor 1C is favorably maintained.

As the multilayer ceramic capacitor 1C, a multilayer ceramic capacitor preferably including a dimension in the width direction W of about 0.30 mm±20%, a dimension in the length direction L of about 0.40 mm±20%, and a dimension in the lamination direction T (height direction) of about 0.4 mm±20%, is able to be suitably used.

In a relation of dimensions as described above, when a distance between an end of the inner electrode layer 12 positioned on the side surface $10b1$ of the pair of side surfaces $10b1$ and $10b2$ and the side surface $10b1$, along the width direction W, as well as a distance between an end of the fourth inner electrode layer 121 positioned on the side surface $10b2$ of the pair of side surfaces $10b1$ and $10b2$ and the side surface $10b2$, along the width direction W, is set at not less than about 20 μm and not more than about 40 μm, as viewed from the lamination direction T, and when a distance between an end of the fourth inner electrode layer 121 positioned on the end surface $10c2$ of the pair of end surfaces $10c1$ and $10c2$ and the end surface $10c2$, along the length direction L, as well as a distance between an end of the fifth inner electrode layer 122 positioned on the end surface $10c1$ and the end surface $10c1$, along the length direction L, is set at not less than about 30 μm and not more than about 50 μm, as viewed from the lamination direction T, the reliability of a multilayer capacitor is able to be secured while downsizing and large-capacity thereof are achieved.

In the preferred embodiments described above, an internal structure of a multilayer ceramic capacitor is not limited to the structure described above, and can be appropriately changed.

While the non-limiting examples in which an electronic component is a multilayer ceramic capacitor is described in the preferred embodiments described above, for example, the present invention is not limited to this case. Thus, various electronic components each including an external electrode, such as a piezoelectric component, a thermistor, and an inductor, can be used as the electronic component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component that is able to be mounted on a mounting substrate including a pair of first edge portions that faces each other, and a pair of second edge portions that is perpendicular or substantially perpendicular to the pair of first edge portions and faces each other, the mounting substrate including a structure that allows at least any one of the electronic component, a first electronic component, and a second electronic component to be mounted thereon;

the first electronic component including:
　a first laminate including a plurality of first dielectric layers and a plurality of first inner electrode layers, which are laminated, a pair of first principal surfaces facing each other in a lamination direction, a pair of first side surfaces facing each other in a width direction perpendicular or substantially perpendicular to the lamination direction, and a pair of first end surfaces facing each other in a length direction perpendicular or substantially perpendicular to the lamination direction and the width direction; and
　a pair of first external electrodes each extending from a corresponding one of the pair of first end surfaces to a portion of the pair of first principal surfaces and to a portion of the pair of first side surfaces;

the second electronic component including:
　a second laminate including a plurality of second dielectric layers and a plurality of second inner electrode layers, which are laminated, a pair of second principal surfaces facing each other in a lamination direction, a pair of second side surfaces facing each other in a width direction perpendicular or substantially perpendicular to the lamination direction, and a pair of second end surfaces facing each other in a length direction perpendicular or substantially perpendicular to the lamination direction and the width direction; and
　a pair of second external electrodes each extending from a corresponding one of the pair of second end surfaces to a portion of the pair of second principal surfaces and to a portion of the pair of second side surfaces; wherein a dimension of the first electronic component in the length direction is designated as L1, a dimension of the first electronic component in the width direction is designated as W1, a dimension of the second electronic component in the length direction is designated as L2, and a dimension of the second electronic component in the width direction is designated as W2;

a length W3 of the pair of first edge portions is a least common multiple of the W1 and the W2; and a length L3 of the pair of second edge portions is a least common multiple of the L1 and the L2;

the electronic component including:
　a third laminate including a plurality of third dielectric layers and a plurality of third inner electrode layers, which are laminated, a pair of third principal surfaces facing each other in a lamination direction, a pair of third side surfaces facing each other in a width direction perpendicular or substantially perpendicular to the lamination direction, and a pair of third end surfaces facing each other in a length direction perpendicular or substantially perpendicular to the lamination direction and the width direction; and
　a pair of third external electrodes each extending from a corresponding one of the pair of third end surfaces to a portion of the pair of third principal surfaces and to a portion of the pair of third side surfaces; wherein a dimension of the electronic component in the width direction is any one of the W1 and the W2; and a dimension of the electronic component in the length direction is the L2 when the dimension of the electronic component in the width direction is the W1; and a dimension of the electronic component in the length direction is the L1 when the dimension of the electronic component in the width direction is the W2.

2. The electronic component according to claim 1, wherein the L1 is about 0.6 mm±20%;

the W1 is about 0.3 mm±20%;

the L2 is about 0.4 mm±20%; and the W2 is about 0.2 mm±20%.

3. The electronic component according to claim 1, wherein
the electronic component has a dimension T3 as a dimension in a height direction; and
the T3 is about 0.4 mm±20%.

4. The electronic component according to claim 1, wherein when a dimension of the first electronic component in a height direction is designated as T1, the T1 is about 0.2 mm±20%.

5. The electronic component according to claim 1, wherein when a dimension of the second electronic component in a height direction is designated as T2, the T2 is about 0.3 mm±20%.

6. The electronic component according to claim 1, wherein the electronic component is a multilayer ceramic capacitor.

7. The electronic component according to claim 1, wherein the first electronic component is a multilayer ceramic capacitor.

8. The electronic component according to claim 1, wherein the second electronic component is a multilayer ceramic capacitor.

9. The electronic component according to claim 1, wherein the first and second electronic components are multilayer ceramic capacitors.

10. The electronic component according to claim 1, wherein the mounting substrate is a printed circuit board.

* * * * *